(12) United States Patent
Jeffers et al.

(10) Patent No.: US 11,693,456 B2
(45) Date of Patent: Jul. 4, 2023

(54) VAPOUR CHAMBER

(71) Applicant: Nokia Technologies Oy, Espoo (FI)

(72) Inventors: Nick Jeffers, Wicklow (IE); Diarmuid O'Connell, Athy (IE); Ian Davis, Wicklow (IE); Akshat Agarwal, Clonmagaddan (IE); Oliver Burns, County Meath (IE)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 17/383,841

(22) Filed: Jul. 23, 2021

(65) Prior Publication Data

US 2022/0026961 A1 Jan. 27, 2022

(30) Foreign Application Priority Data

Jul. 24, 2020 (EP) .................................... 20187711

(51) Int. Cl.
*G06F 1/16* (2006.01)
*G06F 1/20* (2006.01)
*H01L 23/427* (2006.01)
*H05K 7/20* (2006.01)

(52) U.S. Cl.
CPC ............ *G06F 1/1681* (2013.01); *G06F 1/203* (2013.01); *G06F 1/206* (2013.01); *H01L 23/427* (2013.01); *H05K 7/20336* (2013.01); *G06F 2200/201* (2013.01); *G06F 2200/203* (2013.01)

(58) Field of Classification Search
CPC ............. G06F 2200/203; G06F 1/1681; G06F 2200/201; G06F 1/20; H05K 5/0226; H05K 7/20336; H05K 7/20327; H05K 7/20509; H05K 7/20409; H05K 7/2099; F28D 15/02; F28D 15/0275; F28D 15/04; F28D 15/046; F28D 15/0208; F28D 15/0266; F28F 2280/10
See application file for complete search history.

(56) References Cited

U.S. PATENT DOCUMENTS

| 5,588,483 | A | * | 12/1996 | Ishida | .................... | H01L 23/427 |
| | | | | | | 361/679.52 |
| 5,646,822 | A | * | 7/1997 | Bhatia | ..................... | F28D 15/02 |
| | | | | | | 361/679.52 |

(Continued)

OTHER PUBLICATIONS

Extended European Search Report received for corresponding European Patent Application No. 20187711.5, dated Mar. 3, 2021, 11 pages.

*Primary Examiner* — Michael A Matey
(74) *Attorney, Agent, or Firm* — Harrington & Smith

(57) ABSTRACT

Examples of the disclosure relate to vapour chambers. Examples of the disclosure can provide an apparatus comprising: at least a first vapour chamber portion and a second vapour chamber portion wherein the vapour chamber portions comprise walls housing an internal volume where the internal volume is configured to enable vapour flow; at least one hinge formed from walls of the first vapour chamber portion and walls of the second vapour chamber portion and configured to enable the first vapour chamber portion to be moved relative to the second vapour chamber portion; and wherein the hinge is thermally conductive and configured to enable heat to be transferred from the first vapour chamber portion to the second vapour chamber portion.

10 Claims, 13 Drawing Sheets

(56) References Cited

U.S. PATENT DOCUMENTS

Figure 1:
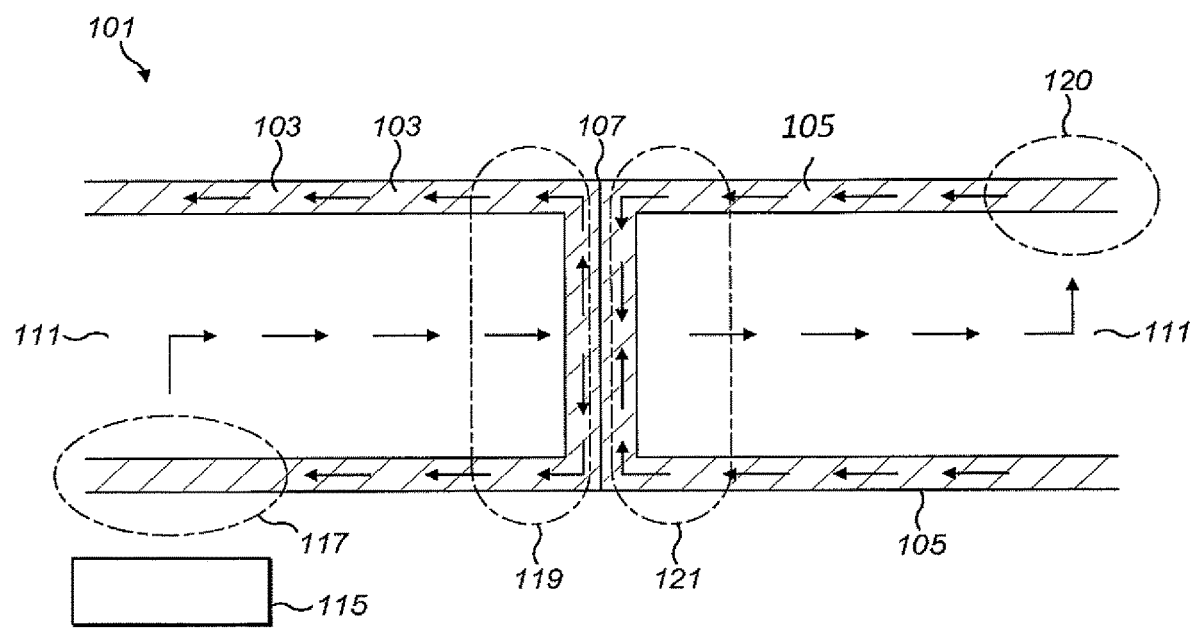

| | | | | |
|---|---|---|---|---|
| 5,910,883 | A * | 6/1999 | Cipolla | F28D 15/0233 |
| | | | | 361/679.52 |
| 6,148,906 | A * | 11/2000 | Li | F28D 15/046 |
| | | | | 361/679.52 |
| 6,185,102 | B1 * | 2/2001 | Shou | G06F 1/203 |
| | | | | 361/679.52 |
| 7,288,895 | B2 * | 10/2007 | Rossi | H01J 61/52 |
| | | | | 315/112 |
| 9,268,377 | B2 * | 2/2016 | MacDonald | G06F 1/203 |
| 9,980,412 | B2 * | 5/2018 | Qiu | H05K 1/181 |
| 11,245,782 | B2 * | 2/2022 | Hong | G06F 1/1616 |
| 2005/0180109 | A1 * | 8/2005 | Miyazaki | G06F 1/203 |
| | | | | 361/700 |
| 2009/0071632 | A1 * | 3/2009 | Bryant | F28D 15/04 |
| | | | | 165/104.26 |
| 2009/0207569 | A1 * | 8/2009 | Tsunoda | G06F 1/203 |
| | | | | 361/704 |
| 2013/0027886 | A1 * | 1/2013 | Crooijmans | G06F 1/1624 |
| | | | | 361/704 |
| 2018/0284856 | A1 * | 10/2018 | Shah | G06F 1/206 |
| 2019/0041922 | A1 * | 2/2019 | Kurma Raju | G06F 1/1637 |
| 2019/0254194 | A1 * | 8/2019 | Paavola | G06F 1/20 |
| 2019/0317574 | A1 * | 10/2019 | North | G06F 1/203 |
| 2019/0354148 | A1 * | 11/2019 | Delano | G06F 1/203 |

* cited by examiner

VAPOUR CHAMBER

TECHNOLOGICAL FIELD

Examples of the present disclosure relate to vapour chambers. Some relate to vapour chambers for use in hinged devices.

BACKGROUND

Hinged or otherwise flexible electronic devices are known. Such devices comprise components such as processors which generate unwanted levels of heat. Therefore, components that enable distribution of this heat are useful.

BRIEF SUMMARY

According to various, but not necessarily all, examples of the disclosure there can be provided an apparatus comprising: at least a first vapour chamber portion and a second vapour chamber portion wherein the vapour chamber portions comprise walls housing an internal volume where the internal volume is configured to enable vapour flow; at least one hinge formed from walls of the first vapour chamber portion and walls of the second vapour chamber portion and configured to enable the first vapour chamber portion to be moved relative to the second vapour chamber portion; and wherein the hinge is thermally conductive and configured to enable heat to be transferred from the first vapour chamber portion to the second vapour chamber portion.

The at least one hinge may comprise a thermally conductive material.

The at least one hinge may comprise one or more of, teethed structure, interleaved projections, ball and socket arrangement.

The walls may define at least part of an external housing of the vapour chamber portions.

The walls may comprise a wick structure configured to enable flow of a working fluid via capillary action.

The first vapour chamber portion may be configured so that working fluid condenses on the area of the walls that forms the hinge and the second vapour chamber portion may be configured so that working fluid evaporates from the area of the walls that forms the hinge.

The first chamber portion may be configured to be positioned in proximity to a heat source.

The vapour chamber portions may comprise an internal support structure configured to support the walls of the vapour chamber portions.

The internal support structure may comprise one or more struts configured to control flow of working fluid within the vapour chamber portions.

The support structure may be formed using an additive manufacturing process.

The apparatus may comprise more than two vapour chamber portions connected by hinges.

According to various, but not necessarily all, examples of the disclosure there can be provided an electronic device comprising an apparatus as described above The electronic device may comprise one or more screens.

According to various, but not necessarily all, examples of the disclosure there can be provided a method comprising: designing a support structure for a vapour chamber wherein the support structure comprises a network of struts; modelling fluid flow through the network of struts to determine one or more parameters of the network of struts; and adjusting the network of struts to improve the one or more parameters.

The one or more parameters may comprise thermal resistance, pressure drop.

The network of struts may be designed to be manufactured using additive manufacturing.

Designing a support structure may comprise creating structures from a plurality of nodes within a base plane where the struts satisfy one or more set requirements.

The set requirements may comprise any one or more of; that struts do not overlap, that the struts are a minimum distance apart.

The struts may maintain spacing between external walls of the vapour chamber to provide an internal volume for fluid flow.

According to various, but not necessarily all, examples of the disclosure there can be provided a vapour chamber apparatus comprising an internal support structure designed using the methods described above.

BRIEF DESCRIPTION

Figure 2:
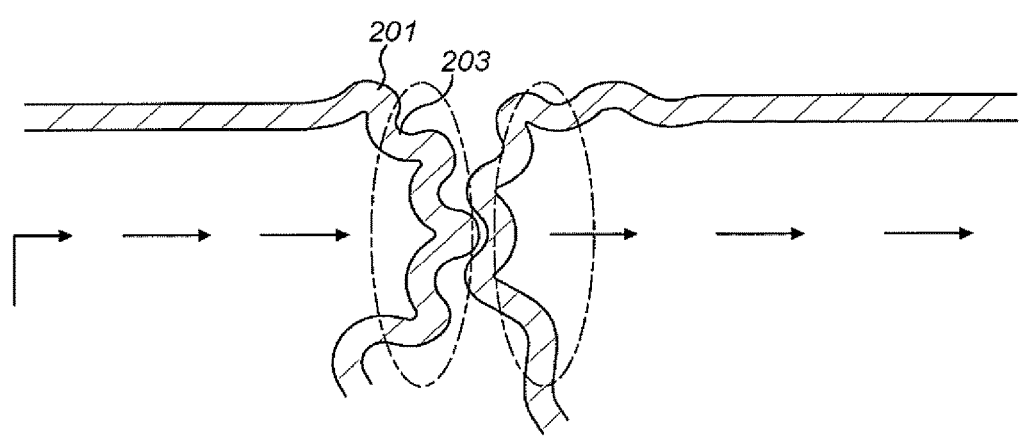
Figure 3A:
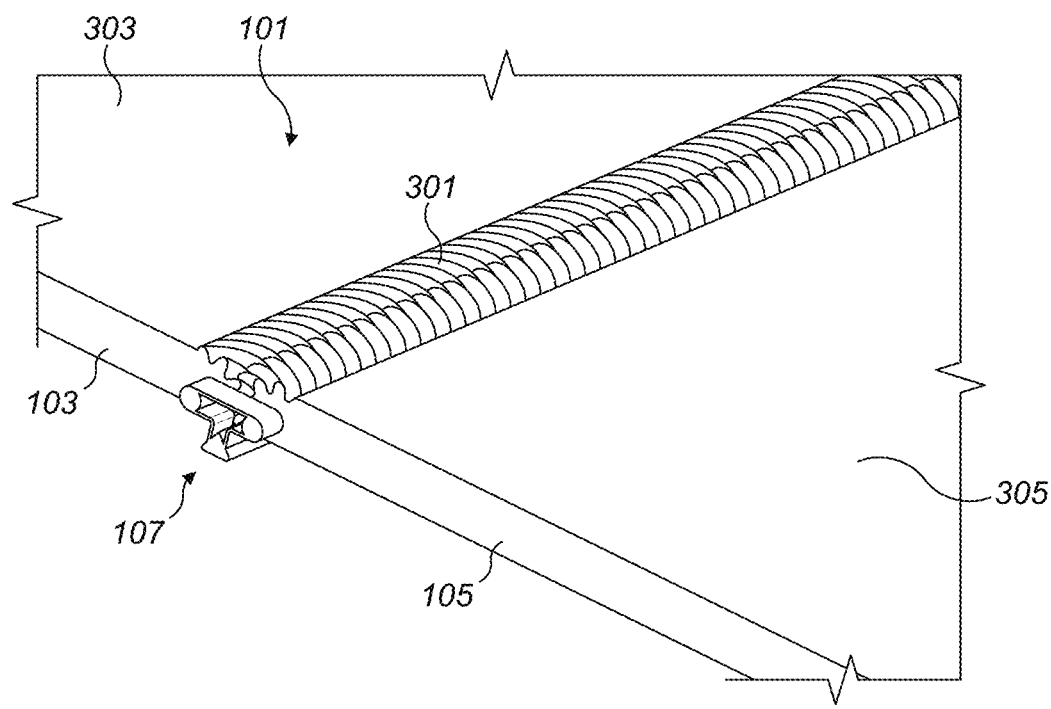
Figure 3B:
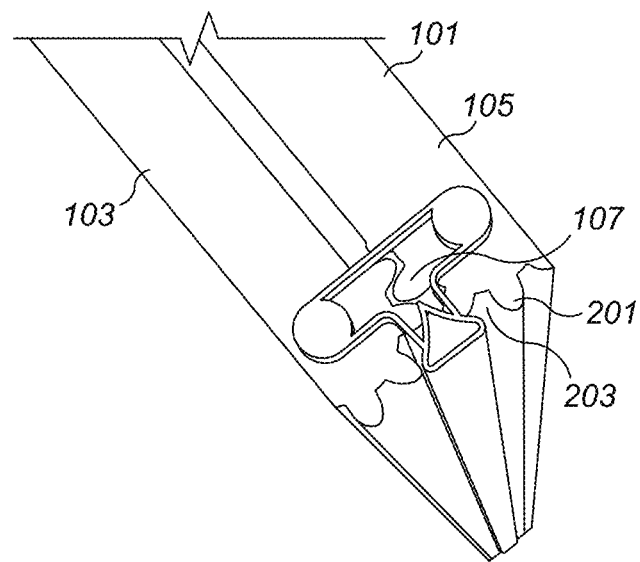
Figure 4:
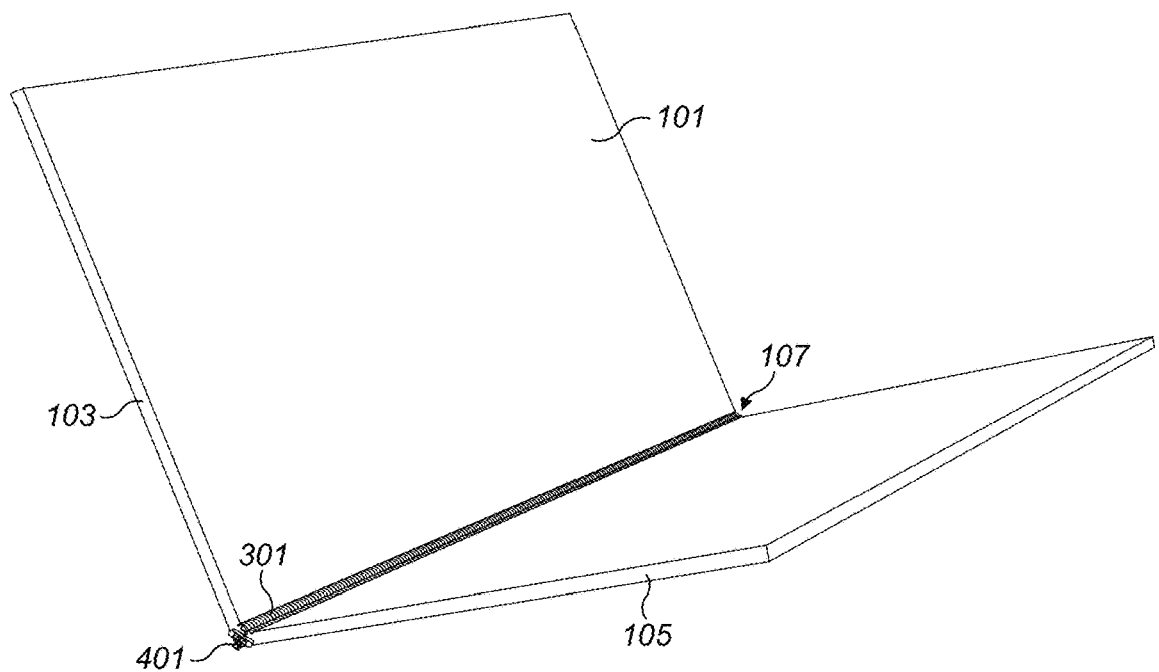
Figure 5:
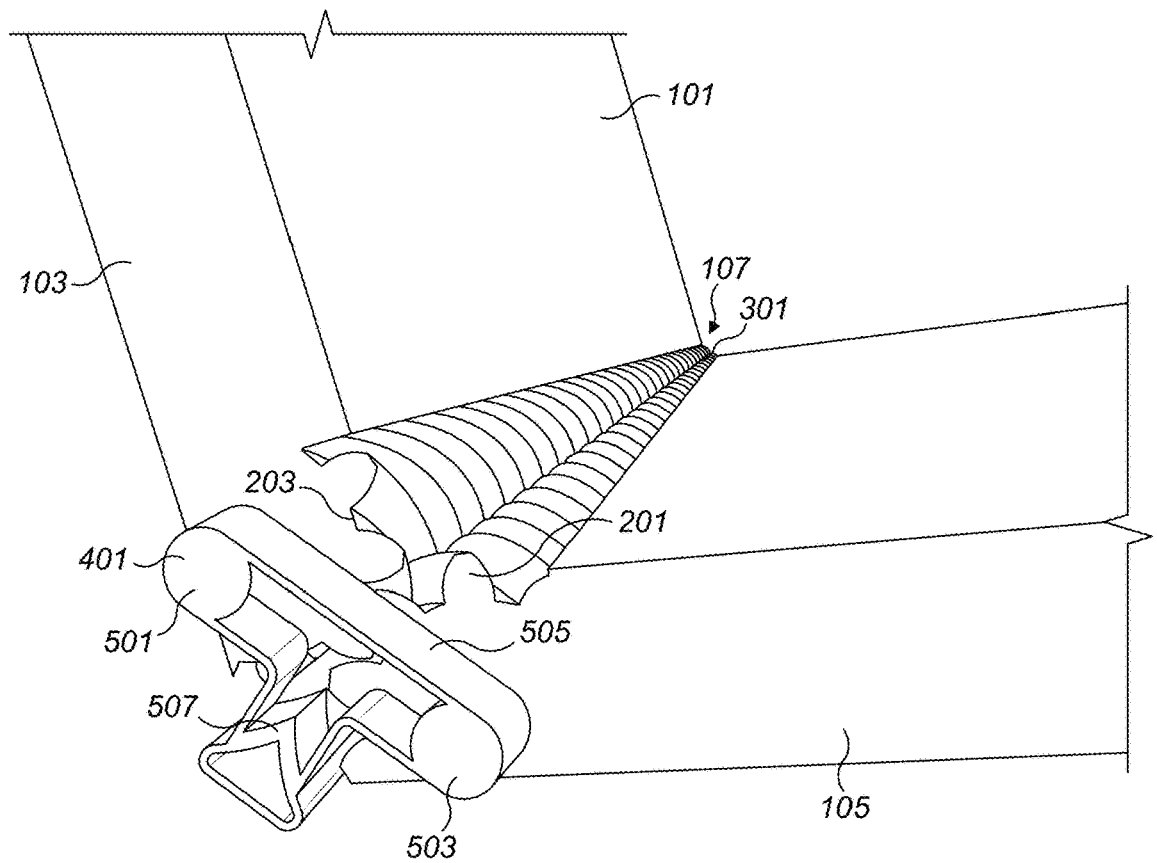
Figure 6:
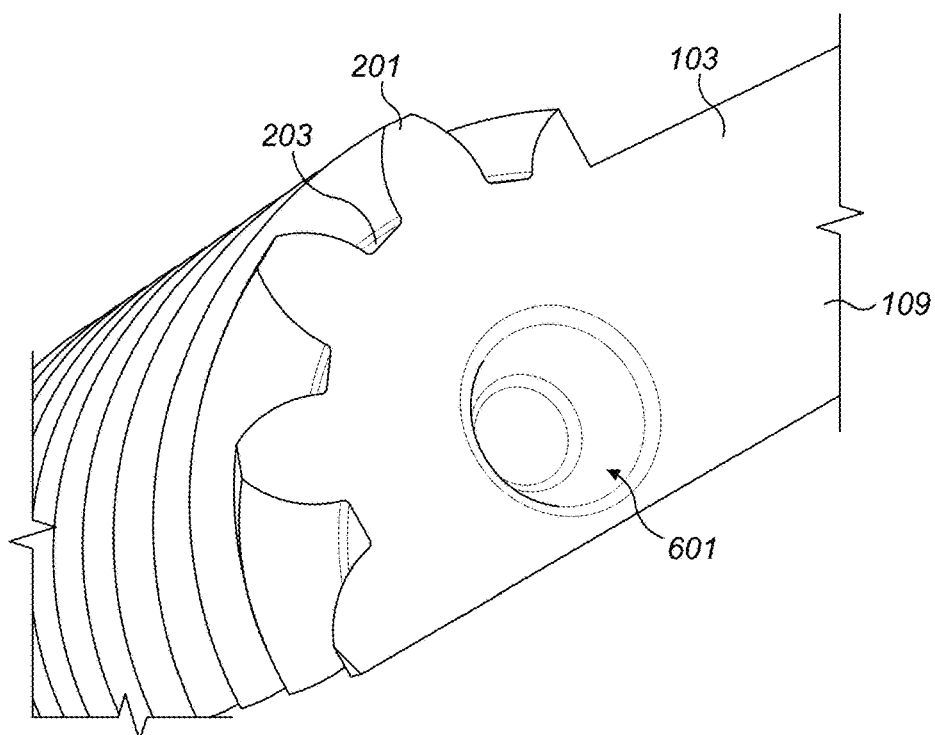
Figure 7A:
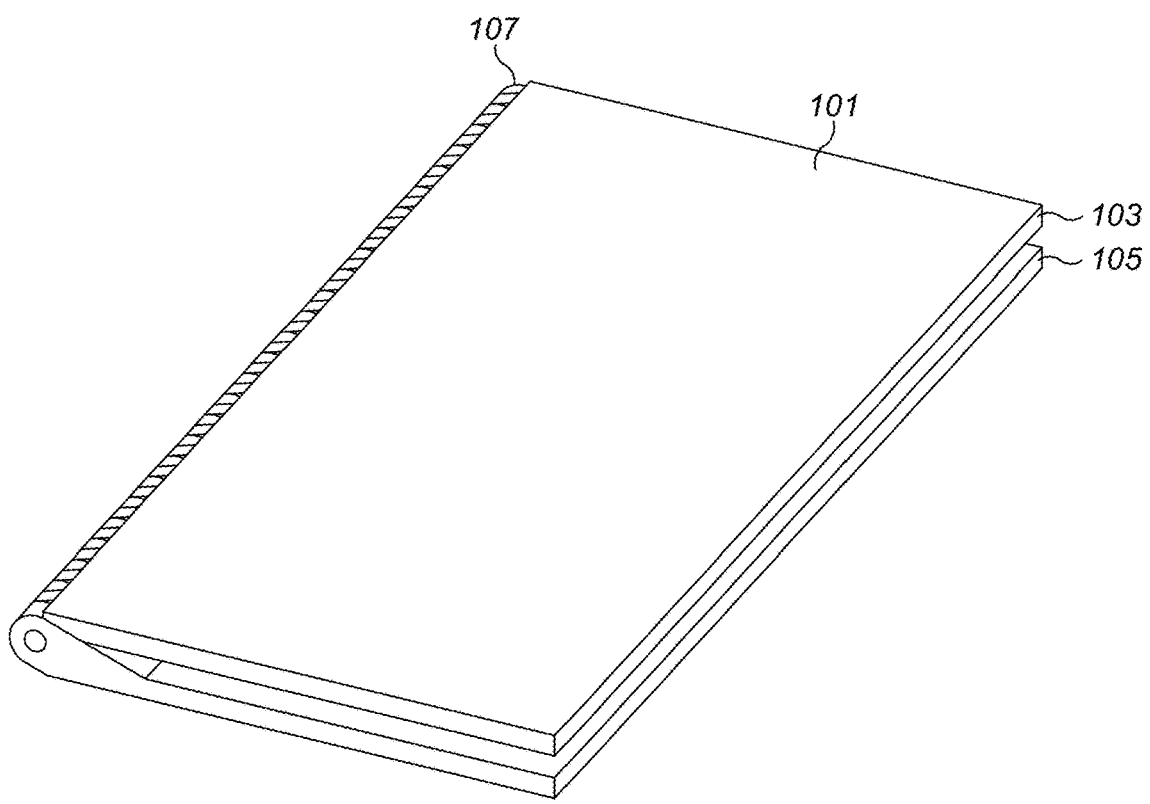
Figure 7B:
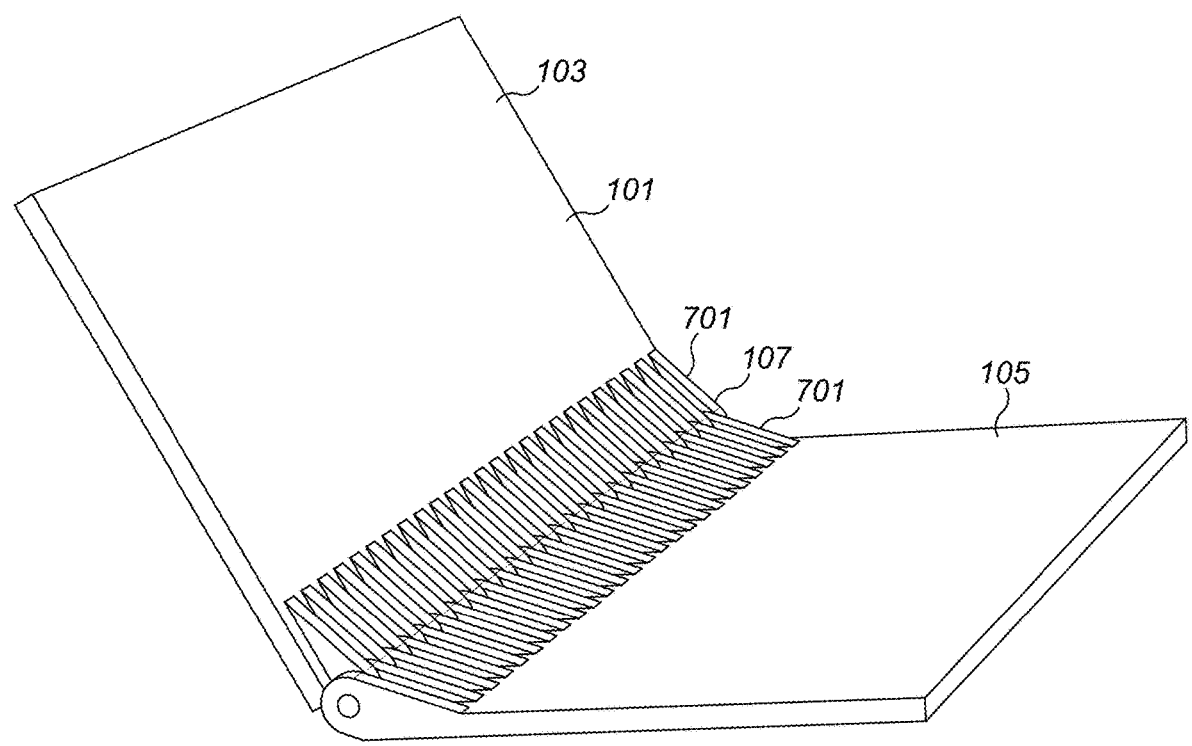
Figure 7C:
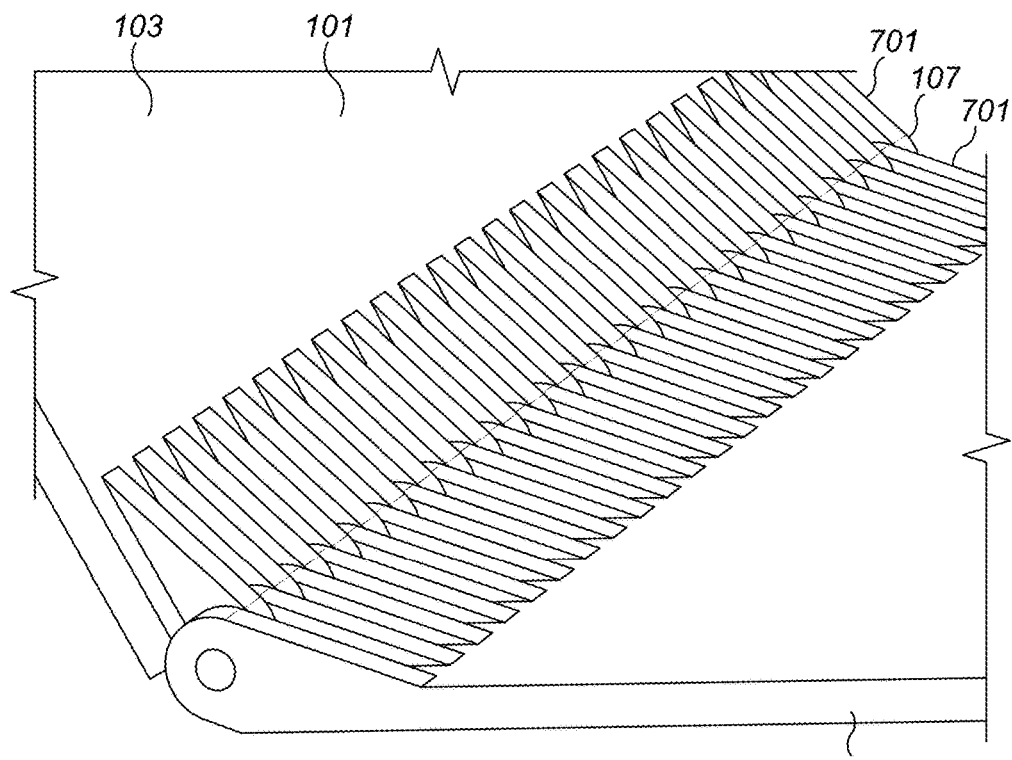
Figure 8A:
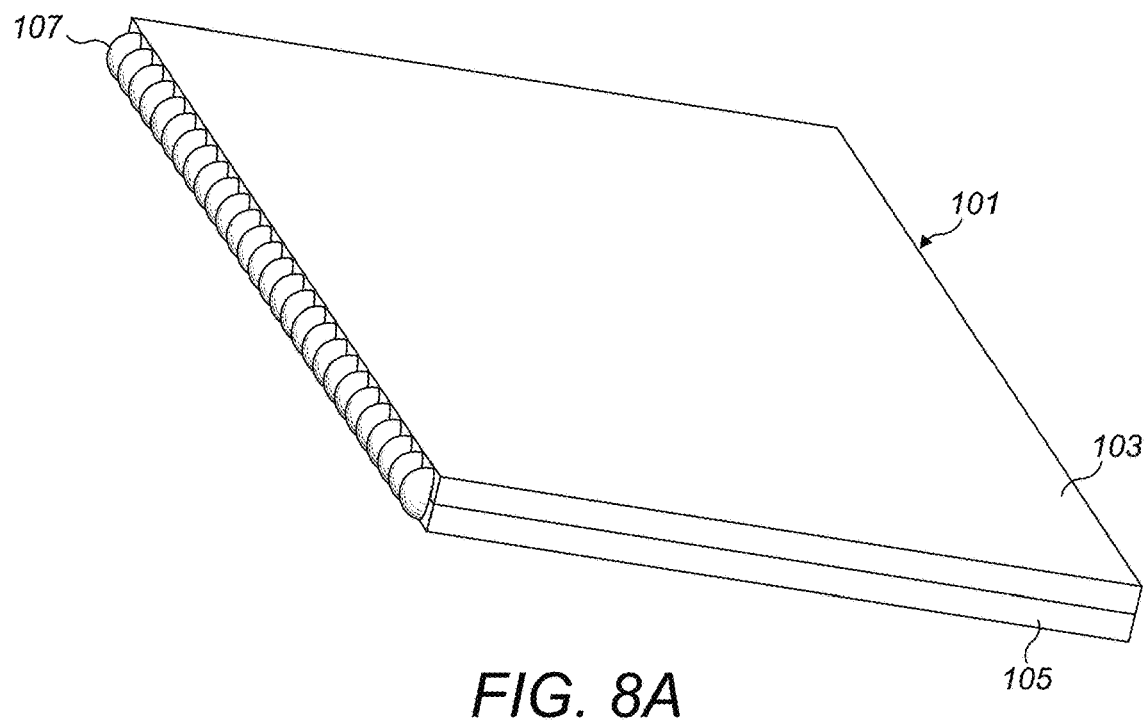
Figure 8B:
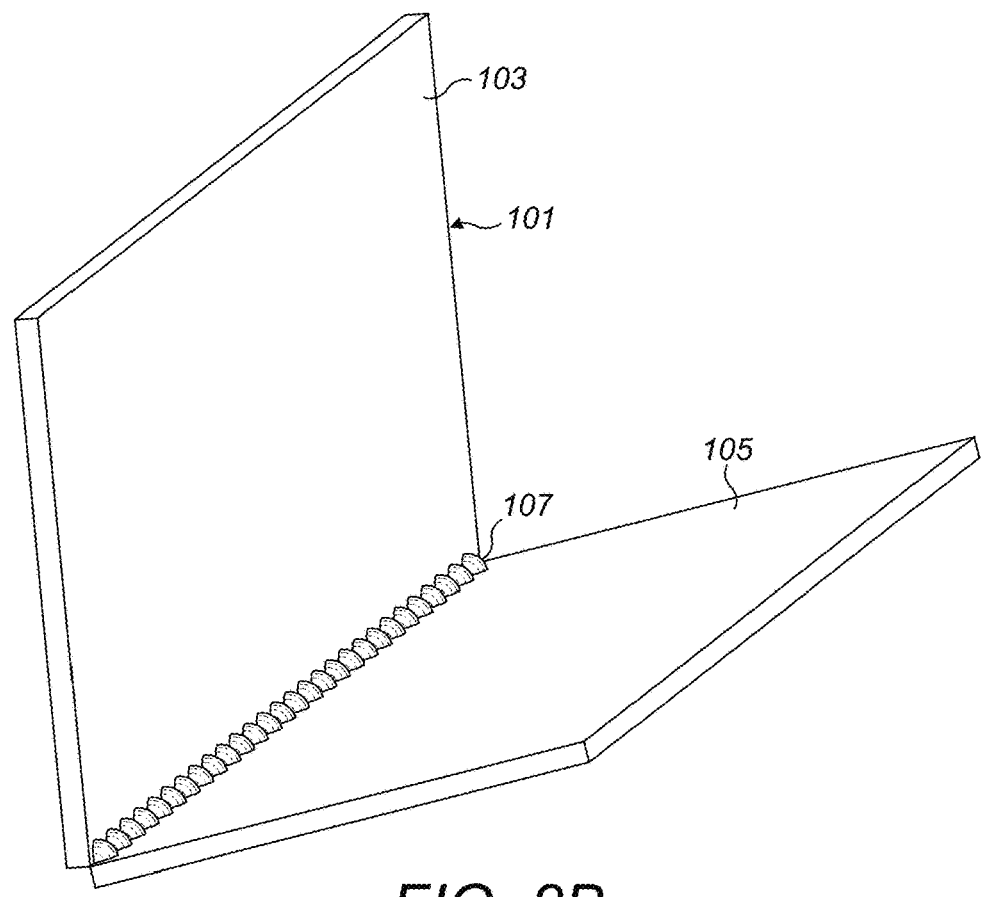
Figure 8C:
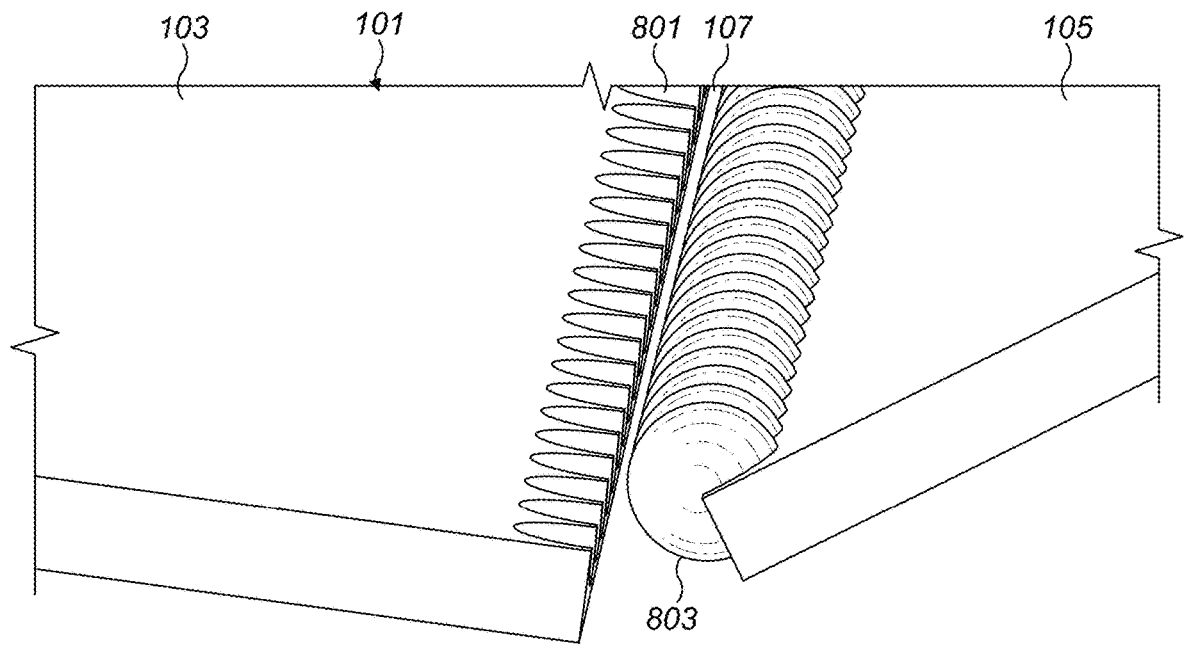
Figure 9:
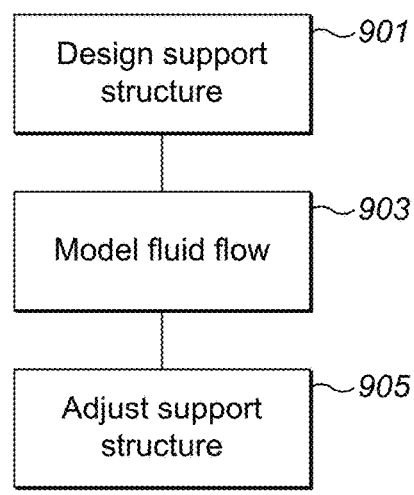

Some examples will now be described with reference to the accompanying drawings in which:
FIG. 1 shows an apparatus;
FIG. 2 shows a cross section through an apparatus;
FIGS. 3A and 3B show an apparatus in open and closed configurations;
FIG. 4 shows an apparatus;
FIG. 5 shows a hinge of an apparatus;
FIG. 6 shows a hinge of an apparatus;
FIGS. 7A to 7C show another example hinge;
FIGS. 8A to 8C show another example hinge;
FIG. 9 shows an example method; and
FIGS. 10A to 10H show details of an example method.

DETAILED DESCRIPTION

Examples of the disclosure relate to vapour chambers. Some examples relate to hinged vapour chambers. The hinged vapour chambers comprise at least two vapour chamber portions that are configured to be moved relative to each other. The hinges are also configured to enable heat to be transferred across the hinge between the different vapour chamber portions.

FIG. 1 schematically shows a cross section through an apparatus 101 according to examples of the disclosure. The apparatus 101 comprises a first vapour chamber portion 103, a second vapour chamber portion 105 and a hinge 107.

Each of the vapour chamber portions 103, 105 comprise walls 109. The walls 109 house an internal volume 111. A first internal volume 111 is provided inside the first vapour chamber portion 103 and a second internal volume 111 is provided inside the second vapour chamber portion 105. The internal volumes 111 are configured to enable vapour flow within the vapour chamber portions 103, 105. The internal volumes 111 are configured to enable flow of a working fluid in a vapour phase. The walls 109 separate the internal volumes 111 of the vapour chamber portions 103, 105 so that the working fluid does not flow between the respective vapour chamber portions 103, 105.

The walls 109 define the external housing of the apparatus 101. The walls 109 comprise a thermally conductive material. The thermally conductive material can enable heat to be conducted into the internal volume 111 or out of the internal volume 111. In some examples the walls 109 can comprise a metal such as copper. In other examples the walls 109 can comprise a plastic layer which is thin enough to enable heat to be conducted through it. In examples where the walls 109 comprise plastic one or more electronic components can be printed or otherwise provided on the plastic outer surface of the walls 109.

The walls 109 can comprise a wick structure. The wick structure can be provided on the internal surfaces of the walls 109. The wick structure can be configured to enable flow of a working fluid in a liquid phase. The wick structure can comprise a plurality of capillary channels configured to enable flow of the working fluid via capillary action. The wick structure can be formed by sintering or any other suitable process.

A hinge 107 is provided between the first vapour chamber portion 103 and the second vapour chamber portion 105. The hinge 107 enables the first vapour chamber portion 103 to be moved relative to the second vapour chamber portion 105. The hinge 107 can provide a pivot point that enables the first vapour chamber portion 103 to be rotated relative to the second vapour chamber portion 105.

The hinge 107 is formed from the walls 109 of the vapour chamber portions 103, 105. The hinge 107 is thermally conductive so that heat can be conducted from the first chamber portion 103 to the second vapour chamber portion 105 through the section of the walls 109 that form the hinge 107.

In the example shown in FIG. 1 the hinge 107 couples the first vapour chamber portion 103 directly to the second vapour chamber portion 105 so that there are no intervening components between the first vapour chamber portion 103 and the second vapour chamber portion 105. The walls 109 of the first vapour chamber portion 103 are in direct thermal contact with the walls 109 of the second vapour chamber portion 105 so as to ensure that heat can be conducted between the vapour chamber portions 103, 105 through the hinge 107.

When the apparatus 101 is in use a working fluid is provided within the vapour chamber portions 103, 105. The working fluid could be water or any other suitable fluid. When the apparatus 101 is in use the working fluid circulates through the vapour chamber portions 103, 105 so as to enable heat distribution. When the working fluid is in the internal volume 111 the working fluid is in a gas phase and when the working fluid is in the wick structure the working fluid is in a liquid phase.

When the apparatus 101 is in use a first end of the first vapour chamber portion 103 is provided in proximity to a heat source 115. The first end of the first vapour chamber portion 103 is provided in proximity to a heat source 115 so that heat from the heat sources 115 can be transferred to the first end of the first vapour chamber portion 103. When the first end of the first vapour chamber portion 103 is provided in proximity to a heat source 115 it is provided within any range of distance from the heat source 115 that enables this transfer to occur. The heat source 115 could be an electronic component such as a processor or a screen that generates unwanted heat during use or any other suitable source of heat. The heat source 115 creates an evaporator region 117 within the first vapour chamber portion 103.

A second end of the first vapour chamber portion 103 provides a condenser region 1. In the examples of the disclosure the condenser region 119 is provided in the hinge 107 where the walls 109 of the first vapour chamber portion 103 are in thermal contact with the walls 109 of the second vapour chamber portion 105. The hinge 107 has a cooler temperature than the region around the heat source 115.

At the evaporator region 117, heat from the heat source 115 causes the working fluid to evaporate and change phase from a liquid to a gas. The working fluid in the gas phase travels from the evaporator region 117, through the internal volume 111 to the condenser region 119 at the hinge 107. At the condenser region 119, the comparatively cooler temperature causes the working fluid to condense and change phase from a gas to a liquid. As a result, heat is moved from the evaporator region 117 to the condenser region 119 in the hinge 107.

At the condenser region 119, the working fluid condenses back into a liquid phase and travels back to the evaporator region 117 through capillary action in the wick structure in the walls 109. Once the liquid phase working fluid has reached the evaporator region 117 again the heat at the evaporator region 117 will change the working fluid back into the gas phase. The cycle of the working fluid changing phase repeats so as to drive the working fluid in the gas phase and the heat from the evaporator region 117 to the condenser region 119 in the hinge 107.

A similar process is performed in the second vapour chamber portion 105. In the second vapour chamber portion 105 an evaporator region 121 is provided in the hinge 107 so that heat transferred from the first vapour chamber portion 103 through the hinge 107 causes the evaporation of the working fluid in the second vapour chamber portion 105.

In the second vapour chamber portion 105 shown in FIG. 1 the condenser region 120 is provided at the opposite end of the second vapour chamber portion 105 to the hinge 107 which has a cooler temperature than the region around the hinge 107.

At the evaporator region 121, heat from first vapour chamber portion 103 that is conducted through the walls 109 of the hinge 107 causes the working fluid to evaporate and change phase from a liquid to a gas. In examples of the disclosure the heat is transferred from the first vapour chamber portion 103, 105 to the second vapour chamber portion 105 via conduction through the walls 109. There is no transfer of the working fluid between the vapour chamber portions 103, 105.

The working fluid in the gas phase travels from the evaporator region 121, through the internal volume 111 to the condenser region 120 at the opposite end of the second vapour chamber portion 105. At the condenser region 120, the comparatively cooler temperature causes the working fluid to condense and change phase from a gas to a liquid. As a result, heat is moved from away from the evaporator region 121 in the hinge 107.

At the condenser region 120, the working fluid condenses back into a liquid phase and travels back to the evaporator region 121 through capillary action of the wick structure in the walls 109. Once the liquid phase working fluid has reached the evaporator region 121 again the heat at the evaporator region 121 will change the working fluid back into the gas phase. The cycle of the working fluid changing phase repeats so as to drive the working fluid in the gas phase and the heat from the evaporator region 121 in the hinge to the condenser region 120 at the other end of the second vapour chamber portion 105.

The hinged vapour chamber portions 103, 105 therefore enable heat to be transferred away from heat sources 115 to other locations. The vapour chamber portions 103, 105 can therefore be used for heat distribution in hinged or otherwise deformable electronic devices.

It is to be appreciated that the apparatus 101 could comprise additional components that are not shown in FIG. 1. For instance, the apparatus 101 can comprise internal support structures within the internal volumes 111. The internal support structures can be configured to support the walls 109 of the vapour chamber portions 103, 105.

The internal support structures can be formed using additive manufacturing or any other suitable process. The internal support structures can comprise a plurality of struts or supports that are positioned so as to control the flow of the working fluid in the vapour phase through the internal volume 111.

FIG. 2 shows a cross section of an example hinge 107 of an apparatus 101. The apparatus 101 comprises a first vapour chamber portion 103 and a second vapour chamber portion 105 which are as described above and shown in FIG. 1. Corresponding reference numerals are used for corresponding features.

In the example apparatus 101 shown in FIG. 2 the hinge 107 is formed from the walls 109 of vapour chamber portions 103, 105 so that the walls 109 of the first vapour chamber portion 103 are in direct thermal contact with the walls 109 of the second vapour chamber portion 105. In this example the hinge 107 is teethed so as to increase the surface area of the walls 109 that are in thermal contact. This provides for efficient heat transfer between the first vapour chamber portion 103 and the second vapour chamber portion 105.

In the example of FIG. 2 the teethed hinge 107 comprises a plurality of projections 201 and recesses 203 on the surfaces of the walls 109 of each vapour chamber portion 103, 105. The projections 201 on each vapour chamber portion 103, 105 fit into corresponding recesses 203 in the wall of the other vapour chamber portion 103, 105. The projections 201 and recesses 203 are configured to allow the vapour chamber portions 103, 105 to be rotated relative to each other about the hinge 107.

The projections 201 and recesses 203 are provided over the surface of the hinge 107 so that as the hinge 107 is moved between open and closed configurations the projections 201 and recesses 201 mesh together. This ensures that there is a large surface area available for heat transfer when the apparatus 101 is in an open configuration, or a closed configuration or an intermediate configuration.

FIGS. 3A and 3B show perspective views of a section of an apparatus 101 comprising a teethed hinge 107 such as the apparatus 101 shown in FIG. 2.

FIG. 3A shows the apparatus 101 in an open configuration and FIG. 3B shows the apparatus 101 in a closed configuration. It is to be appreciated that the apparatus 101 could also be used in an intermediate configuration in which the apparatus 101 is partially open.

In the example shown in FIGS. 3A and 3B the hinge comprises a teethed structure comprising projections 201 and recesses 203 as shown in FIG. 2. In the example shown in FIGS. 3A and 3B the projections 201 and recesses 203 are provided on a helical structure 301 that extends along an edge of the apparatus 101. In the example shown in FIGS. 3A and 3B the helical structure 301 extends along the whole of the adjacent edges of the first vapour chamber portion 103 and the second vapour chamber portion 105. The helical structure 301 provides a large surface area for thermal contact between the first vapour chamber portion 103 and the second vapour chamber portion 105 so as to enable efficient heat transfer between the vapour chamber portions 103, 105.

The helical structure 301 allows the rotation of the first vapour chamber portion 103 relative to the second vapour chamber portion 105. The helical structure is configured so that as the apparatus 101 is moved between an open an closed configuration the projections 201 and recesses 203 provided on the surface of the helical structure can be meshed together.

In FIG. 3A the apparatus 101 is shown in a fully open configuration. In the fully open configuration the first vapour chamber portion 103 is positioned so that an edge of the first vapour chamber portion 103 is positioned adjacent to a corresponding edge of the second vapour chamber portion 105. A first face 303 of the first vapour chamber portion 103 is provided level, or substantially level, with a first face 305 of the second vapour chamber portion 105 so as to create a large surface area for the apparatus 101.

In FIG. 3B the apparatus 101 is shown in a fully closed configuration. In the fully closed configuration the first vapour chamber portion 103 is positioned so that a first face 303 of the first vapour chamber portion 103 is positioned adjacent to a corresponding first face 303 of the second vapour chamber portion 105.

It is to be appreciated that the apparatus 101 could also be configured in partially open configurations which would comprise positions in between those shown in FIGS. 3A and 3B.

FIG. 4 shows a perspective view of an apparatus 101 comprising a first vapour chamber portion 103 and a second vapour chamber portion 105. In this example both the first vapour chamber portion 103 and the second vapour chamber portion 105 have rectangular shapes. Other shapes of vapour chamber portions 103, 105 could be used in other examples of the disclosure.

The hinge 107 is provided along the walls 109 of the respective vapour chamber portions 103, 105. The hinge 107 extends along the length of the walls 109 so that it is provided along the whole of the adjacent sides of the respective vapour chamber portions 103, 105. This provides a large surface area for heat exchange between the vapour chamber portions 103, 105.

In the example shown in FIG. 4 the hinge 107 comprises a teethed helical structure 301 which can be as shown in FIGS. 2 and 3A and 3B. The teeth of the helical structure 301 comprise projections 201 and recesses 203 that are configured so that projections 201 on the first vapour chamber portion 103 fit into recesses 203 in the second vapour chamber portion 105 and correspondingly projections 201 on the second vapour chamber portion 105 fit into recesses 203 in the first vapour chamber portion 103.

In the example shown in FIG. 4 a connector 401 is provided between the first vapour chamber portion 103 and the second vapour chamber portion 105. The connector 401 secures the two vapour chamber portions 103, 105 together while allowing the relative movement of the two vapour chamber portions 103, 105. The connector 401 is configured to hold the vapour chamber portions 103, 105 securely against each other so as to ensure good thermal contact between the first vapour chamber portion 103 and the second vapour chamber portion 105. The connector 401 can ensure that the two vapour chamber portions 103, 105 are held in good thermal contact as the two vapour chamber portions 103, 105 are moved relative to each other.

FIG. 5 shows an example connector 401 in more detail. The connector 401 comprises a first pin 501 that is coupled to the first vapour chamber portion 103 and a second ping 503 that is coupled to the second vapour chamber portion 105. A connecting member 505 is provided between the first pin 501 and the second pin 503. The connecting member 505 prevents the two pins 501, 503 from moving away from each other and so ensures that the two vapour chamber portions 103, 105 are held securely together while allowing the rotation of the two vapour chamber portions 103, 105 relative to each other.

The connector 401 also comprises a pivot 507 which provides a point for the hinge 107 to pivot against. The pivot 507 is provided between the first pin 501 and the second pin 503.

In the example shown in FIG. 5 the pins 501, 503 comprise projections that fit into recesses within the walls 109 of the respective vapour chamber portions. This enables the connectors 401 to be fitted to the outer surface of the apparatus 101.

FIG. 6 shows an example recess 601 that can be provided in the outer surface of the apparatus 101. FIG. 6 shows a section of the walls 109 of a vapour chamber portion. The vapour chamber portion could be a first vapour chamber portion 103 or a second vapour chamber portion 105.

The recess 601 comprises a circular indent that is provided within the external walls 109 in an area close to the hinge 107. The recess 601 is shaped to correspond to the shapes of the pins 501, 503 of the connector 401. The recess 601 is sized and shaped so that a pin 501,503 from the connector fits tightly in the recess 601 and can be held in place as the apparatus 101 is moved between an open and closed configuration. The recess 601 does not extend through the walls 109. The internal volume 111 formed by the walls 109 remains sealed.

In the example shown in FIG. 6 the recess 601 is shallow so that it does not project very far into the walls 109 of the vapour chamber portion 103, 105. This ensures that the recess 601 and pins 501, 503 do not project into the area of the hinge 107 where heat transfer is occurring and helps to ensure that a large surface area is provided for the heat transfer between the first vapour chamber portion 103 and the second vapour chamber portion 105.

In the example shown in FIG. 6 the indent provided is circular to enable a circular pin 501, 503 to be fitted into the recess 601. In other examples a different shaped pins 501, 503 and recesses 601 could be provided.

FIGS. 7A. to 7C. shows another example apparatus 101 with a different type of hinge 107. The apparatus 101 comprises a first vapour chamber portion 103 and a second vapour chamber portion 105 which can be as shown in FIG. 1 and described above. Corresponding reference numerals are used for corresponding features. FIG. 7A shows the apparatus 101 in a closed configuration, FIG. 7B shows the apparatus 101 in a closed configuration, and FIG. 7C shows the a close up of the hinge.

In the example shown in FIGS. 7A to 7C the hinge 107 comprises an interleaved structure rather than a teethed helical structure 301. Each of the vapour chamber portions 103, 105 comprise a plurality of projections 701 that extend out of the outer surface of the vapour chamber portion 103, 105. The plurality of projections 701 extend along the length of the edges of the vapour chamber portion 103, 105 that forms the hinge 107. The plurality of projections 701 are positioned spaced from each other so that a gap is provided between adjacent projections 701. The gaps are sized so that a corresponding projection 701 from the other vapour chamber portion 103, 105 fits tightly within the gap. This ensures that the surfaces of a projection 701 on the first vapour chamber portion 103 are in good thermal contact with the surfaces of a projection 701 on the second vapour chamber portion 105. This provides a large surface area between the interleaved projections 701 to enable good heat transfer between the respective vapour chamber portions 103, 105.

In the example shown in FIGS. 7A to 7C the projections 701 have a substantially triangular cross section that extends out of the outer surface of the respective vapour chamber portions 103, 105. It is to be appreciated that other shapes could be used for the projections 701 in other examples of the disclosure.

FIGS. 8A. to 8C. shows another example apparatus 101 with another different type of hinge 107. The apparatus 101 shown in FIGS. 8A to 8C also comprises a first vapour chamber portion 103 and a second vapour chamber portion 105 which can be as shown in FIG. 1 and described above. Corresponding reference numerals are used for corresponding features. FIG. 8A shows the apparatus 101 in a closed configuration, FIG. 8B shows the apparatus 101 in a closed configuration and FIG. 8C shows an exploded view of the hinge 107.

In the example shown in FIGS. 8A to 8C the hinge 107 comprises a ball and socket arrangement. The first vapour chamber portion 103 comprises a plurality of sockets 801 that extend along the edge of the first vapour chamber portion 103 that forms the hinge 107. The sockets 801 comprise partly spherical recesses that are configured to received ball shaped projections 803.

The second vapour chamber portion 105 comprises a plurality of ball projections 803 that extend along the edge of the second vapour chamber portion 105 that forms the hinge 107. The ball projections 803 are sized and shaped so as to fit into the corresponding sockets 801 in the first vapour chamber portion 103. As shown in the examples in FIGS. 8A to 8C the projections are partly spherical. This allows the rotation of the first vapour chamber portion 103 relative to the second vapour chamber portion 105 while maintaining good thermal contact between the two vapour chamber portions 103, 105.

Examples of the disclosure therefore provide for a vapour chamber apparatus 101 that can be used in an articulated or otherwise flexible device. The flexible device can comprise components that generate unwanted heat during use. For example the flexible device could be an electronic device comprising one or more screens that generate heat during use and/or the flexible device could be an electronic device comprising one or more processors that generate unwanted heat during use.

It is to be appreciated that variations from the above described examples can be made. For instance, in the above described examples the apparatus 101 comprises two vapour chamber portions 103, 105. In other examples the apparatus 101 could comprises more than two vapour chamber portions 103, 105. In such examples the vapour chamber portions 103, 105 could be arranged in a chain or other configuration. The chain could be provided within a watch strap or other wearable device and could enable heat distribution along the length of the chain. The heat distribution could be for the purposes of cooling an electronic device, for providing an alert to a user or for any other suitable purpose.

FIG. 9 shows an example method that can be used to design an internal support structure for an apparatus 101. The internal support structure could be provided within the internal volume 111 of the vapour chamber portions 103, 105.

The method comprises, at block 901, designing a support structure for a vapour chamber wherein the support structure comprises a network of struts.

The vapour chamber that the support structure is provided in can be a vapour chamber portion 103, 105 comprising walls 109 comprising a wick structure as shown above. The support structure can be configured to support the walls 109 so as to define the internal volume 111 of the vapour chamber portions 103, 105. The support structure can be designed to maintain the spacing of the walls 109.

The network of struts can be designed to be formed using an additive manufacturing process.

At block 903 the method comprises modelling fluid flow through the network of struts that form the support structure. This modelling enables one or more parameters of the network of struts to be determined.

When the vapour chamber is in use the working fluid in a vapour phase will flow through the internal volume in which the support structure is provided. The parameters of the fluid flow through the network of struts can therefore be determined to identify if the fluid flow is sufficient.

The parameters that are determined at block 903 can comprise thermal resistance of the struts, pressure drop of the fluid as it flows through the vapour chamber or any other suitable parameter or combination of parameters.

At block 905 the method comprises adjusting the support structure by adjusting the network of struts to improve the one or more parameters. The network of struts could be adjusted by removing one or more struts, reshaping one or more struts, repositioning one or more struts or by any making any other suitable modification.

The process of blocks 903 and 905 can be repeated until the parameters measured at block 903 provide a satisfactory level. The satisfactory level can be a threshold level, a maximum level or any other suitable level.

FIGS. 10A to 10H show details of an example method of designing a support structure.

In this example the design method mimics an additive manufacturing process to ensure that the support structure could be formed using such processes. The example method begins by defining the outer limits of the support structure. The outer limits may be defined by the boundaries of the walls 109 of the vapour chamber portions 103, 105 that will comprise the support structure. In some examples the outer limits can comprise a rectangular shape corresponding to the shape of the vapour chamber portions 103, 105. In other examples the outer limits can comprise a different shape.

In addition to defining the outer limits of the support structure a base plane 1001 is also defined. The base plane 1001 is a plane from which the design of the support structure grows. The base plane 1001 can be equivalent to a build-plate that could be used in additive manufacturing.

Figure 10A:
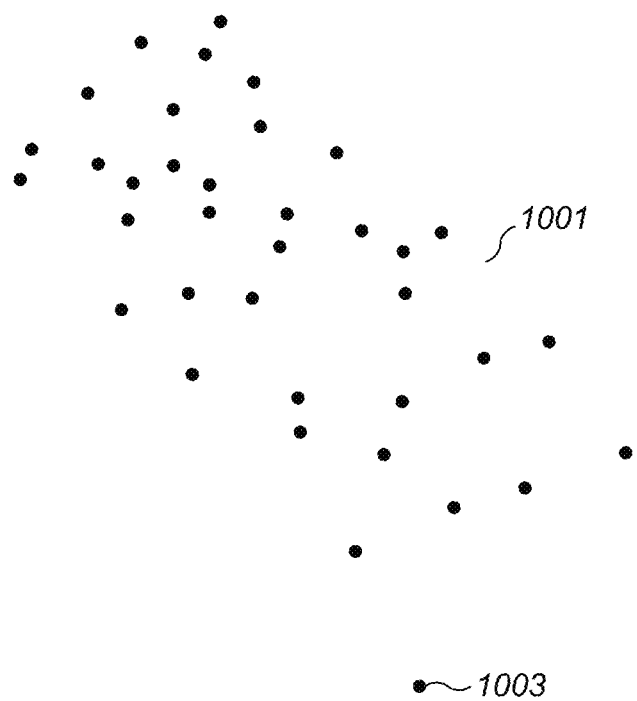

In the example method a plurality of seed nodes 1003 are defined on the base plane 1001. FIG. 10A shows an example plurality of seed nodes 1003. The seed nodes 1003 represent points within space from which struts of the support structure can extend.

The seed nodes 1003 are positioned within the defined outer limits of the support structure.

The plurality of seed nodes 1003 can be defined in any suitable arrangement. In some examples the seed nodes 1003 can be provided in a random, pseudo-random or pre-defined configuration. In some examples the seed nodes 1003 can be distributed evenly over the surface of the base plane 1001. In the example shown in FIG. 10A the seed nodes 1003 have been defined on a base plane 1001 using the Halton sequence. Other pseudo-random distributions of dots can be used in other examples of the disclosure.

Struts are created from the seed nodes 1003 by defining end points. In some examples one or more struts can be created from each of the seed nodes 1003. In other examples the struts can be created from a subset of the seed nodes 1003.

Figure 10B:
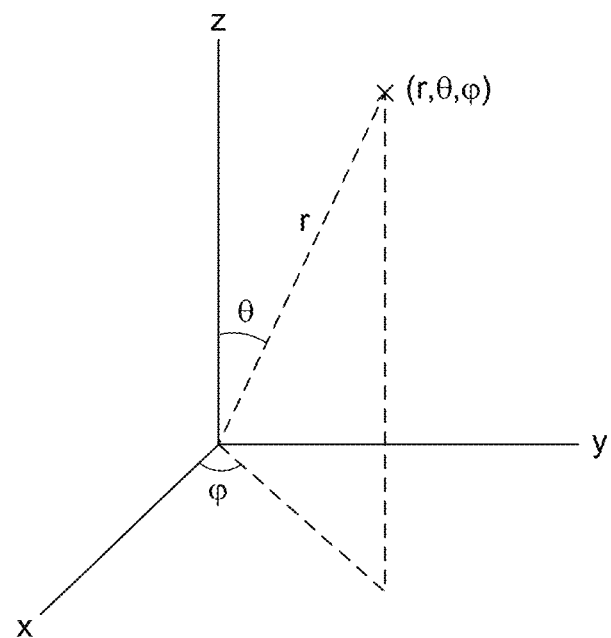

The end point of the struts can be defined in a spherical coordinate system by defining a length (r), polar angle ($\theta$) and azimuthal angle ($\varphi$) as shown in FIG. 10B. The end points of the struts are limited by the requirement that the support structure needs to be formed using an additive manufacturing process.

Figure 10C:
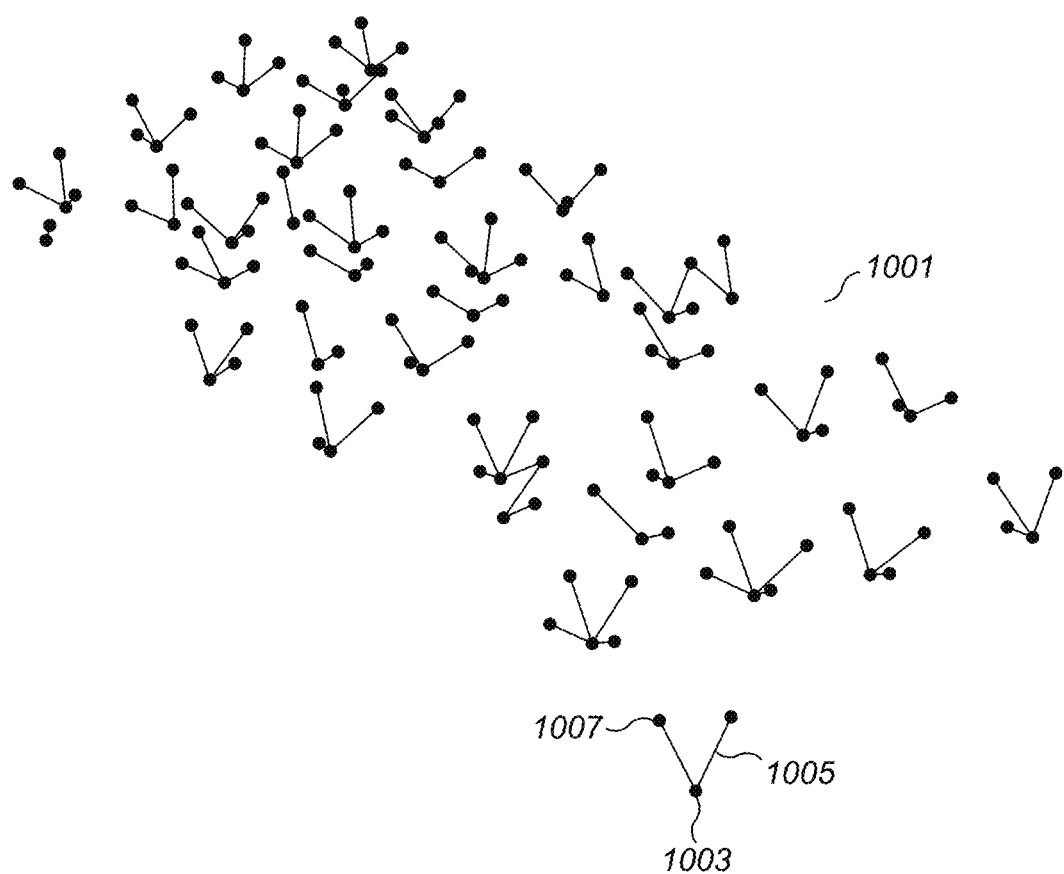

FIG. 10C shows an example layer of struts 1005 that are formed by defining end points 1007 from the seed nodes 1003. In examples of the disclosure it is ensured that the struts 1005 satisfy one or more set requirements. The set requirements comprise that struts 1005 do not overlap or that the struts 1005 are a minimum distance apart or any other suitable set requirements. The minimum distance between the struts 1005 can depend on the required properties of the support structure so that different minimum distances can be used in different implementations of the disclosure.

In the example shown in FIG. 10C a plurality of struts 1005 can originate from a single seed node 1003. In some examples the struts 1005 can contact other struts 1005 at the end points 1007 so that two or more struts 1005 can be joined together.

The end points 1007 of the first layer of struts 1005 provide a second set of seed nodes 1003. The second set of seed nodes 1003 provide points from which a second layer of struts 1005 can extend. The process of defining an end point for the struts 1005 in the second layer can be the same as shown in FIGS. 10B and 10C and described above. It is to be appreciated that any number of layers of struts 1005 can be provided within the design. The process of adding a layer of struts 1005 to the most recent layer can be completed until the internal volume defined by the walls 109 of the vapour chamber portions 103, 105 is sufficiently occupied.

Figure 10D:
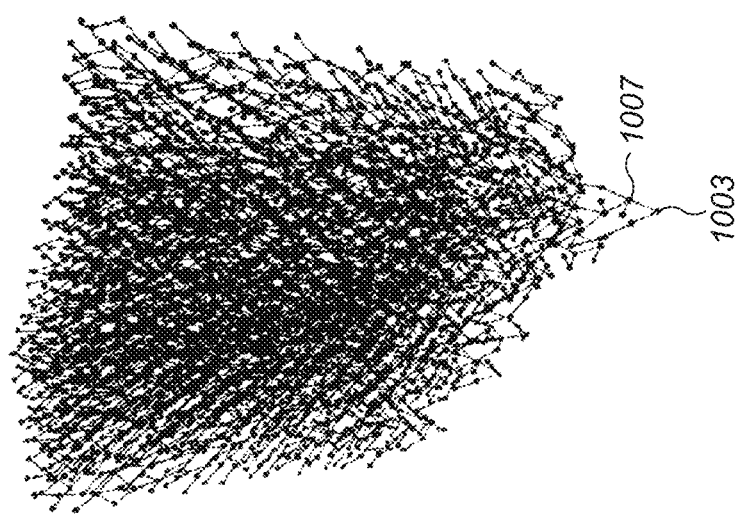
Figure 10D:
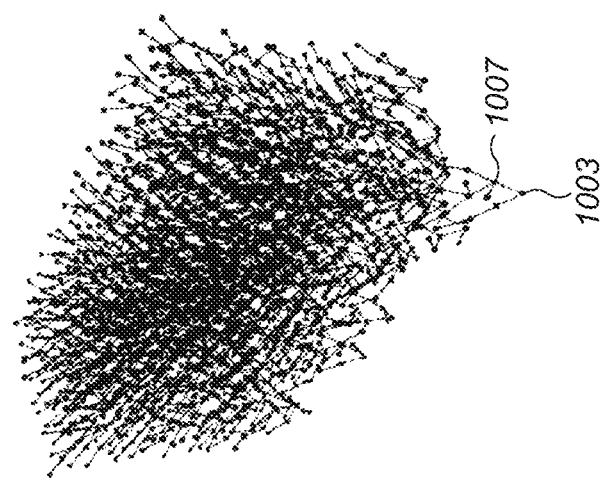
Figure 10D:
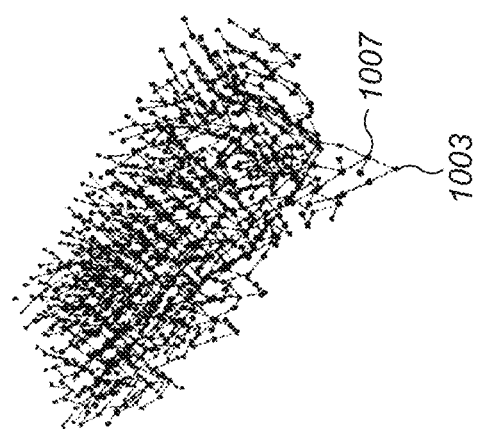

FIG. 10D shows the process of the providing additional layers of struts 1005 upon a first layer of struts 1005. The results in a network of seed nodes 1003 that are connected by the struts 1005. The locations and connectivity between the seed nodes 1003 is known.

Figure 10E:
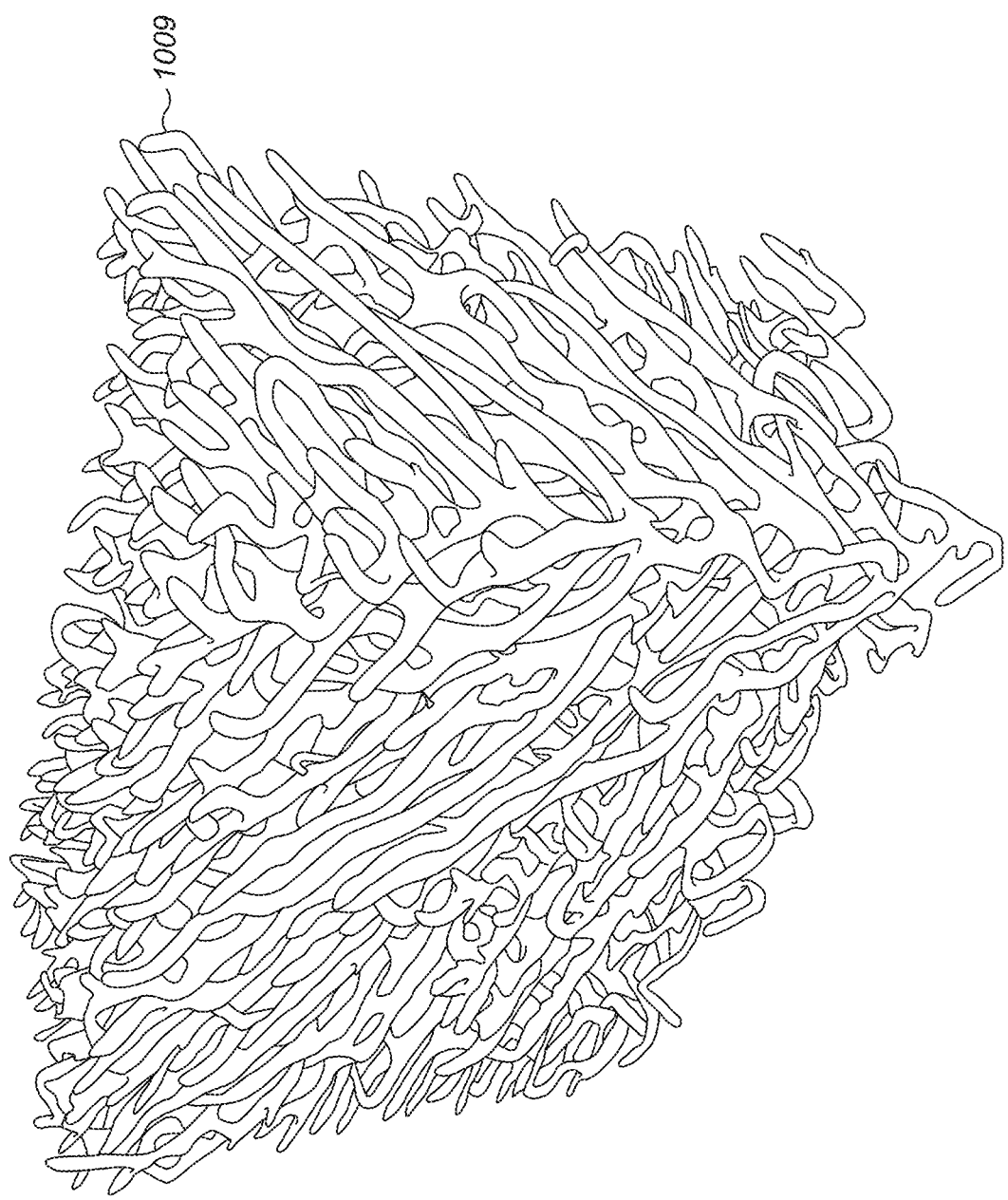

Once the network of seed nodes 1003 has been defined a skin 1009 is then provided over the defined network as shown in FIG. 10E. Any suitable process can be used to define the skin 1009 over the network of seed nodes 1003. In the example shown in FIG. 10E a convex hull method has been used to create the structure. When defining the skin 1009 over the network of seed nodes 1003 the parameters of the skin 1009 can be controlled based on requirements of the support structure. For example, the diameter of a skin 1009 around the network can be dependent upon performance requirements such as structural strength, fluid resistance, pressure drop, thermal resistance and any other suitable parameters.

Figure 10F:
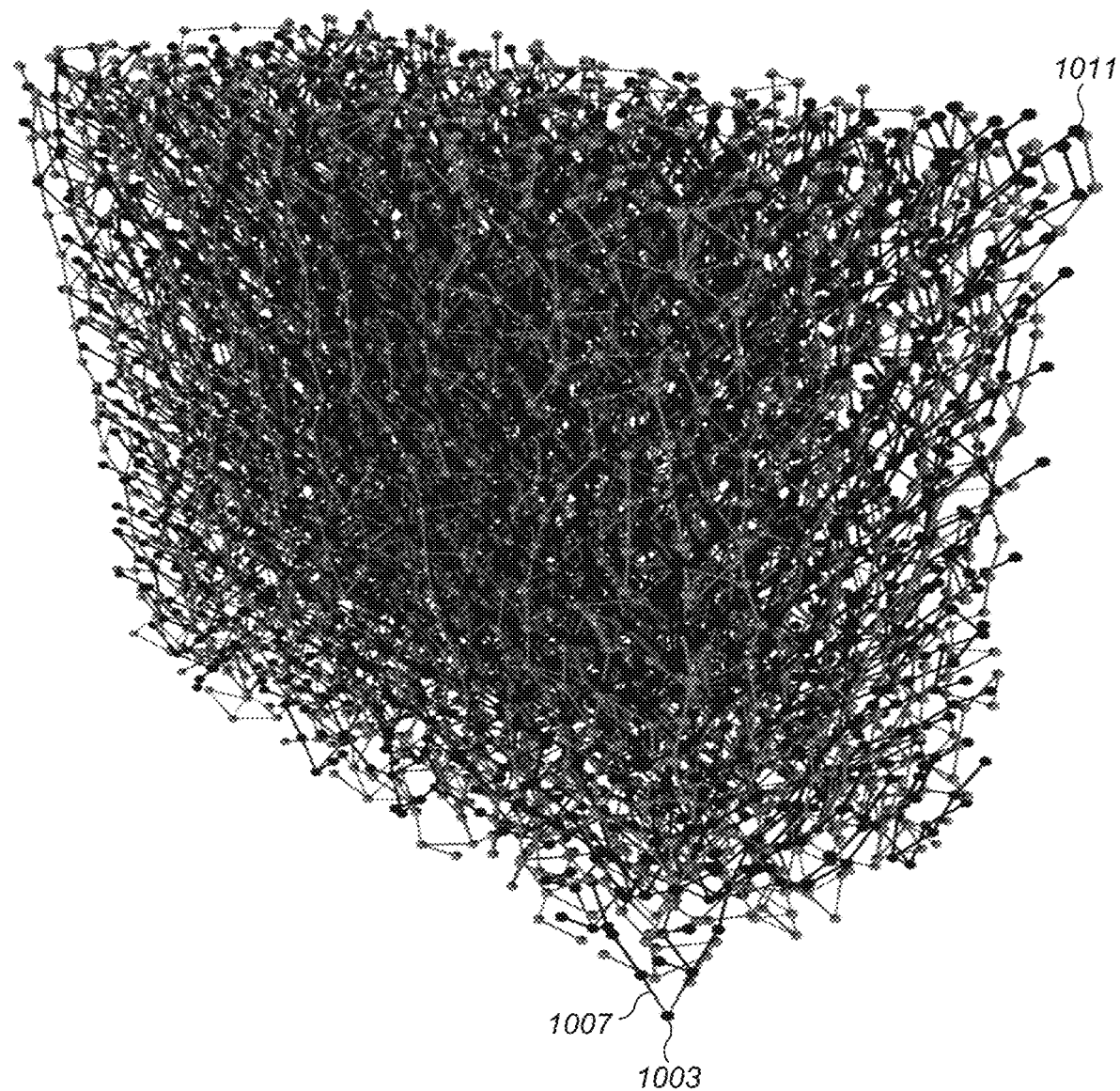

When the support structure is in use, the working fluid in the vapour phase will flow through it. Once the support structure has been designed the flow of the working fluid though the support structure can be modelled. The modelling of the fluid flow can be similar to the designing of the network structure and is shown in FIG. 10F. The modelling of the fluid network starts with a plurality of fluid seed nodes 1011. The fluid seed nodes 1011 are located in the locations where the fluid enters the solid support structure. The locations of the fluid seed nodes 1011 can correspond to the evaporator section of the vapour chamber. Different vapour chambers can have the evaporator sections located in different places. For instance, in the examples described above the evaporator section is located close to an external heat source in the first vapour chamber portion 103 but is located close to the hinge in the second vapour chamber portion 105. Therefore, the locations of the fluid seed nodes 1011 will be dependent upon how the vapour chamber portion 103, 105 is intended to be used.

Once the fluid seed nodes 1011 have been positioned the fluid struts are added. The fluid struts are designed to mimic fluid flow through the solid structure and are free from some of the constraints that are used for the solid struts 1005 such as the capability of being able to manufacture it using additive manufacturing. At each seed node 1011 within the fluid network the locations of the fluid particles and the struts 1005 of the solid support structure are checked to ensure that there is no overlap. A tolerance factor can be added during the check for overlaps to take into account the skin 1009 that is to be added over the solid network of struts 1005.

Once the fluid network has been added to the solid network then the parameters of the designed support structure can be determined. The model can be used to estimate parameters that determine the functioning of the support structure and the vapour chamber portion 103, 105. In some examples the structural strength of the support structure can be estimated by calculating parameters such as volume, surface area and porosity.

Figure 10H:
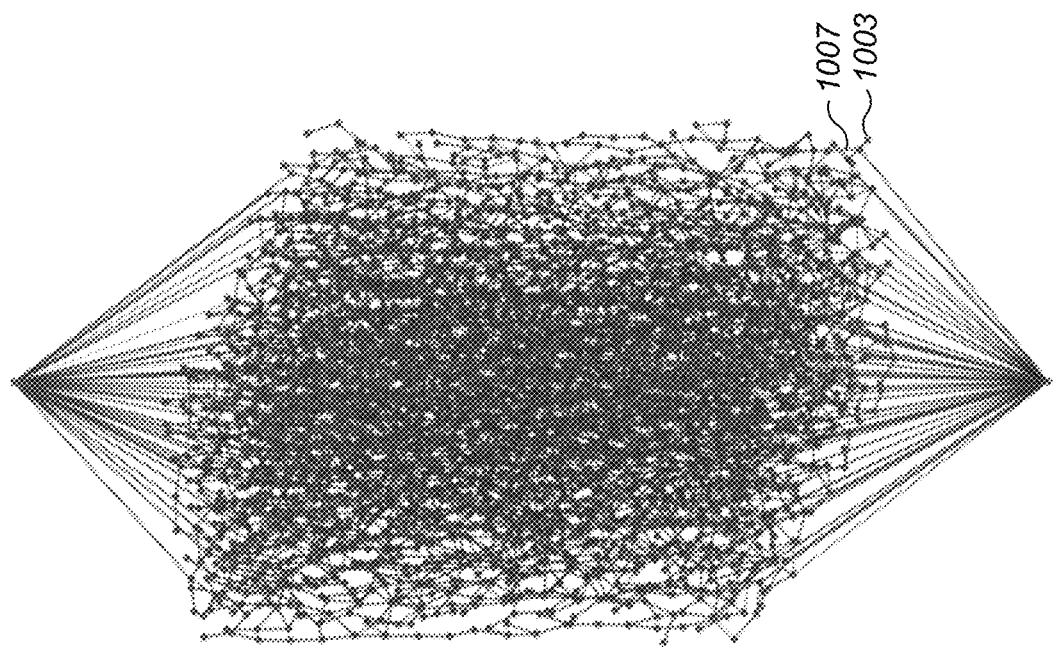
Figure 10G:
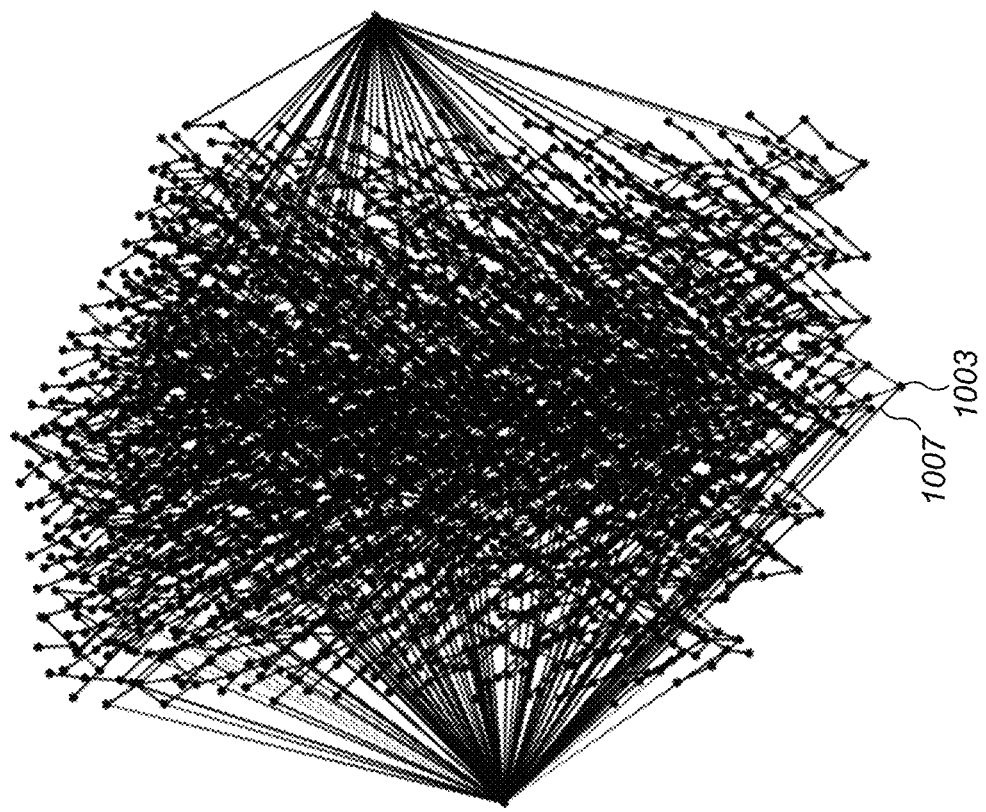

FIG. 10G shows the thermal resistance to conduction through the solid network being calculated. The thermal resistance to conduction through the solid network can be calculated by using an electrical network analogy. Each strut 1005 has an effective thermal resistance defined by, $$R = \frac{l}{kA}$$

l: strut length, k: thermal conductivity, A: strut cross-sectional area

The effective resistance can be calculated by calculating this resistance for each strut 1005 within the network.

FIG. 10H shows the pressure drop across the fluid network being calculated. The pressure drop across the fluid network can be calculated using an electrical network analogy. From Poiseuille flow, the pressure drop for each fluid strut can be defined as, $$\Delta P = \frac{lQ}{A^2}$$

l: strut length, Q: volumetric flow rate, A: cross-sectional area

The strut length within the fluid network is known while the cross-sectional area can be calculated based on the area occupied by the skin 1009 of the support structure. The volumetric flow rate at the inlet can be used to calculate the volumetric flow rate for individual fluid struts. Once these parameters are known, the net pressure drop across the network in the direction of flow as shown in FIG. 10H can be calculated.

Other methods, such as graph theory, can be used to calculate other parameters for solid structure or for the fluid flow. For example, the mean shortest path between any two nodes can be calculated to gauge connectivity within the network, which can be related to a performance parameter.

Once the performance parameters have been determined the support structure can be adjusted to improve the performance parameters. For example, one or more struts 1005 can be moved or otherwise adjusted to improve performance parameters. The networks can be adjusted until one or more of the performance parameters exceed a threshold level.

In the above examples the internal support structure is used in a hinged vapour chamber apparatus 101. It is to be appreciated that in other examples the internal support structure could be provided in different types of vapour chamber apparatus 101 that do not comprise hinges or other flexible portions.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

The invention claimed is:

1. An apparatus comprising:
    at least a first vapour chamber portion comprising a first wall and a second vapour chamber portion comprising a second wall, wherein the first vapour chamber portion houses a first internal volume and the second vapour chamber portion houses a second internal volume, where the first wall is in contact with the second wall, and where the first internal volume is configured to enable heat flow across the first wall and across the second wall and to the second internal volume;
    at least one hinge formed from the first wall and the second wall and configured to enable the first vapour chamber portion to be moved relative to the second vapour chamber portion; and
    wherein the hinge is thermally conductive and configured to transfer heat from the first vapour chamber portion to the second vapour chamber portion;
    wherein the first vapour chamber portion is configured so that a first working fluid condenses on the area of the first wall that forms the hinge and the second vapour chamber portion is configured so that a second working fluid evaporates from the area of the second wall that forms the hinge.

2. The apparatus as claimed in claim 1 wherein the at least one hinge comprises a thermally conductive material.

3. The apparatus as claimed in claim 1 wherein the at least one hinge comprises at least one of, teethed structure, interleaved projections, ball and socket arrangement.

4. The apparatus as claimed in claim 1 wherein the walls define at least part of an external housing of the vapour chamber portions.

5. The apparatus as claimed in claim 1 wherein the walls comprise a wick structure configured to enable flow of a working fluid via capillary action.

6. The apparatus as claimed in claim 1 wherein the first chamber portion is configured to be positioned in proximity to a heat source.

7. The apparatus as claimed in claim 1 wherein each vapour chamber portion comprises a respective internal support structure configured to support the walls of the vapour chamber portion.

8. The apparatus as claimed in claim 7 wherein the internal support structure comprises one or more struts configured to control flow of working fluid within the vapour chamber portions.

9. The apparatus as claimed in claim 7 wherein the support structure is formed using an additive manufacturing process.

10. The apparatus as claimed in claim 1 wherein the apparatus comprises more than two vapour chamber portions connected to each other by hinges.

* * * * *